United States Patent [19]
Okada

[11] Patent Number: 5,959,854
[45] Date of Patent: Sep. 28, 1999

[54] VOLTAGE STEP-UP CIRCUIT AND METHOD FOR CONTROLLING THE SAME

[75] Inventor: Yasuhiro Okada, Tokyo, Japan

[73] Assignee: NEC Corporation, Tokyo, Japan

[21] Appl. No.: 09/107,501

[22] Filed: Jun. 30, 1998

[30] Foreign Application Priority Data

Jun. 30, 1997 [JP] Japan .................................. 9-189245

[51] Int. Cl.[6] .................................................. H02M 3/18
[52] U.S. Cl. ............................................ 363/60; 327/536
[58] Field of Search .......................... 363/59, 60; 307/109, 307/110; 327/536, 537; 365/226

[56] References Cited

U.S. PATENT DOCUMENTS

| | | | |
|---|---|---|---|
| 5,216,588 | 6/1993 | Bajwa et al. ............................... | 363/60 |
| 5,561,385 | 10/1996 | Choi ........................................ | 327/536 |
| 5,627,739 | 5/1997 | Yung-Chow et al. ..................... | 363/60 |
| 5,629,843 | 5/1997 | Loughmiller et al. .................... | 363/60 |
| 5,687,128 | 11/1997 | Lee et al. ................................. | 365/226 |
| 5,767,735 | 6/1998 | Javanifard et al. ...................... | 327/536 |
| 5,801,934 | 9/1998 | Lacey et al. .............................. | 363/60 |

FOREIGN PATENT DOCUMENTS 2-67002  3/1990  Japan .
2-238716  9/1990  Japan .

*Primary Examiner*—Adolf Deneke Berhane
*Attorney, Agent, or Firm*—Foley & Lardner

[57] ABSTRACT

A voltage step-up circuit includes a voltage detecting circuit for generating a discriminating signal when a stepped-up voltage is lower than a previously set value, an oscillating circuit responding to the discriminating signal to oscillate to generate an oscillation signal, a plurality of control circuits receiving the discriminating signal and the oscillation signal in a phase different from one control circuit to another, and a plurality of charge pump circuits independently controlled by the plurality of control circuits, respectively. Each of the control circuits includes a latch circuit for storing a logical condition of an output from each control circuit to a corresponding charge pump circuit when the corresponding charge pump circuit stopped its charge pump operation, a first path receiving the oscillation signal for outputting the oscillation signal as its is to the corresponding charge pump circuit, and a second path receiving the oscillation signal and having an inverter for outputting an inverted signal of the oscillation signal to the corresponding charge pump circuit. the first path and the second path are controlled by the latch circuit to alternatively activated to supply a logical condition opposite to the stored logical condition, to the corresponding charge pump circuit, when the corresponding charge pump circuit restarts its charge pump operation.

8 Claims, 4 Drawing Sheets

VOLTAGE STEP-UP CIRCUIT AND METHOD FOR CONTROLLING THE SAME

BACKGROUND OF THE INVENTION

1. Field of the Invention

The present invention relates to a semiconductor integrated circuit, and more specifically to a voltage step-up circuit incorporated in a semiconductor integrated circuit and a method for controlling the same.

2. Description of Related Art

In a recent dynamic random access memory (called a "DRAM" hereinafter), there is adopted a system for ceaselessly generating a voltage stepped up in a voltage step-up circuit internally provided in a semiconductor chip, in order to drive a word line.

One example of the prior art voltage step-up circuit developed for this purpose is shown in FIG. 1. Referring to FIG. 1, the shown prior art voltage step-up circuit includes a voltage detecting circuit 1, an oscillating circuit 22, a charge pump circuit 3, a control circuit 4 and a compensating capacitor CL, which are connected as shown.

Referring to FIG. 2, there is shown a circuit diagram illustrating one example of the voltage detecting circuit 1. The shown voltage detecting circuit 1 includes a voltage divider consisting of series-connected resistors $R_1$ and $R_2$ having one end connected to receive a stepped-up voltage $V_B$ and the other end connected to ground, and a comparator COMP having one input connected to a connection node between the series-connected resistors $R_1$ and $R_2$ and the other input connected to receive a reference voltage $V_{REF}$. When the stepped-up voltage $V_B$ is lower than a set voltage which is determined by a resistance ratio of the voltage divider and the reference voltage $V_{REF}$, the comparator COMP outputs a step-up circuit control signal $\phi_1$ of a high level. To the contrary, if the stepped-tip voltage $V_B$ is higher than the set voltage, the comparator COMP outputs the step-up circuit control signal $\phi_1$ of a low level.

Returning to FIG. 1, the oscillating circuit 22 has a conventional construction, which includes a ring oscillator 22A constituted of an odd number of cascaded inverters, an output of a last stage inverter being fed back to an input of a first stage inverter, and a buffering circuit 22B composed of an even number of cascaded inverters, for receiving an output of the ring oscillator to shape the waveform of the oscillation signal generated in the ring oscillator.

Referring to FIG. 1, again, a transfer gate $TG_1$ consisting of parallel-connected P-channel transistor and N-channel transistor, is inserted between the output of the last stage inverter of the ring oscillator 22A and the input (node N1) of the first stage inverter, and is connected to receive the step-up circuit control signal $\phi_1$ and its inverted signal at its complementary control inputs, respectively. When the step-up circuit control signal $\phi_1$ is at the high level, the transfer gate $TG_1$ is turned on, so that a path is formed to feed back the output of the last stage inverter of the ring oscillator 22A to the input of the first stage inverter, so that the ring oscillator oscillates. On the other hand, when the step-up circuit control signal $\phi_1$ is at the low level, the transfer gate $TG_1$ is turned off, so that a path for feeding back the output of the last stage inverter of the ring oscillator 22A to the input of the first stage inverter is cut off, so that the ring oscillator stops its oscillation.

The node N1 of the ring oscillator 22A is connected to receive a feedback signal $\phi 3$ from the charge pump circuit control circuit 4 through another transfer gate TG3. This transfer gate TG3 also consists of parallel-connected P-channel transistor a&id N-channel transistor, and is connects to receive the step-up circuit control signal $\phi_1$ and its inverted signal at its complementary control inputs, respectively, so that when the step-up circuit control signal $\phi_1$ is at the high level, the transfer gate $TG_1$ is turned off, and when the step-up circuit control signal $\phi_1$ is at the low level, the transfer gate $TG_1$ is turned on.

Now, the charge pump circuit control circuit 4 shown in FIG. 1 will be explained. An output $\phi 2$ of the oscillating circuit 22 is supplied through a transfer gate TG2 as the feedback signal $\phi 3$ to the transfer gate TG3. An output of the transfer gate TG2 is also connected to a flipflop composed of an inverter $INV_1$ and a tristate inverter $INV_2$ which are connected in parallel to each other but in a mutually opposite direction. An output of the flipflop is connected to the charge pump circuit 3 for driving the charge pump circuit 3.

The transfer gate TG2 also consists of parallel-connected P-channel transistor and N-channel transistor, and is connects to receive the step-up circuit control signal $\phi_1$ and its inverted signal at its complementary control inputs, respectively, so that when the step-up circuit control signal $\phi_1$ is at the high level, the transfer gate $TG_1$ is turned on, and when the step-up circuit control signal $\phi_1$ is at the low level, the transfer gate $TG_1$ is turned off. The tristate inverter $INV_2$ has a control terminal connected to receive the step-up circuit control signal $\phi_1$ so that when the step-up circuit control signal $\phi_1$ is at the high level, the tristate inverter $INV_2$ operates an inverter, and when the step-up circuit control signal $\phi_1$ is at the low level, the tristate inverter $INV_2$ is put in a non-operating condition, namely, an output of the tristate inverter $INV_2$ is maintained in a high impedance condition.

Referring to FIG. 3, there is shown one example of the construction of the charge pump circuit 3. The shown charge pump circuit is of the type called a "complementary circuit type", which has a pair of capacitors $C_1$ and $C_2$ caused to operate in a phase opposite to each other, and which is controlled by the signal $\phi_2$.

When the signal $\phi_2$ is brought from the high level to the low level, an electric charge of the capacitor $C_1$ is outputted to the step-up node $V_B$, and when the signal $\phi_2$ is brought from the low level to the high level, an electric charge of the capacitor $C_2$ is outputted to the step-up node $V_B$.

The electric charge outputted to the step-up node $V_B$ is stored in the compensating capacitor $C_L$ so that the step-up node $V_B$ is maintained at a stepped-up high potential.

Now, an operation of the above mentioned prior art step-up circuit will be described with reference to FIG. 4, which is a timing chart for illustrating the operation of the above mentioned prior art step-up circuit.

When a load of the step-up node $V_B$ such as a word line drive circuit consumes a current with the result that the voltage of $V_B$ becomes lower than the set value, the step-up circuit control signal $\phi_1$ is brought to the high level, so that the oscillating circuit 22 starts to oscillate. Therefore, the signals $\phi_2$ and $\phi_3$ oscillate, to cause the charge pump circuit 3 to operate, so as to elevate the voltage of $V_B$.

If the voltage of $V_B$ becomes higher than the set value, the step-up circuit control signal $\phi_1$ is brought to the low level, as shown by "$t_F$" in FIG. 4, so that the transfer gates TG1 and TG2 are turned off and the transfer gate TG3 is turned on. As a result, the oscillating circuit 22 stops oscillating, but since the signal $\phi_3$ is fed back from the control circuit 4, the output $\phi_2$ of the oscillating circuit 22 stops the oscillating in a phase opposite to that of the signal $\phi_3$ (See $\phi_2$ at a time $t_4$ in FIG. 4).

Thereafter, when the voltage of $V_B$ becomes lower than the set value again, the step-up circuit control signal $\phi_1$ is brought to the high level, so that the transfer gates TG1 and TG2 are turned on and the transfer gate TG3 is turned off. Since the oscillating circuit 22 stopped the oscillating in such a condition that the output $\phi_2$ is in a phase opposite to that of the signal $\phi_3$, the signal $\phi_3$ immediately starts the oscillating.

Thus, the voltage of $V_B$ is ceaselessly maintain-ed to be a high voltage equal to the set value However, in order to supply a stable stepped-up voltage to the DRAM by the charge pump circuit as shown in FIG. 3, the capacitance of the capacitors $C_1$ and $C_2$ is required on the order of several hundred pF and a peak current reaches several hundred mA or more.

If the current of this amount flows through the DRAM circuit, an influence as noise given to other circuits is large.

In order to overcome the above mentioned problem, the following two approaches can be supposed.

A first approach is to cause the charge pump to operate on the basis of a logical processing of a DRAM control signal such as a row address strobe signal, and to inhibit an operation of the charge pump circuit when a sense amplifier operates.

A second approach is to divide the charge pump into a plurality of charge pump circuits which are controlled to operate in phases different from each other.

However, the sense amplifier starts operating after the word line is pulled up. Therefore, before and after the sense amplifier starts operating, the step-up circuit for supplying a stepped-up voltage for the word line is required to stably operate. Accordingly, it is difficult to actually perform the first approach.

On the other hand, if it is attempted to realize the second approach with conventional circuits, a problem is encountered.

Namely, a plurality of oscillating circuits for driving a corresponding number of charge pump circuits, respectively, which operate in different phases, generate output signals different from each other in phase. However, it is impossible to latch these output signals and to feed back them to the oscillating circuits.

SUMMARY OF THE INVENTION

Accordingly, it is an object of the present invention to provide a voltage step-up circuit incorporated in a semiconductor integrated circuit and a method for controlling the same, which have overcome the above mentioned defect of the conventional one.

Another object of the present invention is to provide a voltage step-up circuit incorporated in a semiconductor integrated circuit and configured to disperse a peak current which is otherwise generated by superposition of noises generated when cell data is amplified and noises generated when the step-up circuit operates, thereby to stabilize the cell data amplification, and a method for controlling the same.

The above and other objects of the present invention are achieved in accordance with the present invention by a method for controlling a voltage step-up circuit including a voltage detecting circuit for generating a discriminating signal when a stepped-up voltage is lower than a previously set value, an oscillating circuit responding to the discriminating signal to oscillate to generate an oscillation signal, a plurality of control circuits receiving the discriminating signal and the oscillation signal in a phase different from one control circuit to another, and a plurality of charge pump circuits independently controlled by the plurality of control circuits, respectively, the method comprising storing a logical condition of an output from each control circuit to a corresponding charge pump circuit when the corresponding charge pump circuit stopped its charge pump operation, and forcibly giving a logical condition opposite to the stored logical condition, to the corresponding charge pump circuit when the corresponding charge pump circuit restarts its charge pump operation.

According to another aspect of the present invention, there is provided a voltage step-up circuit including a voltage detecting circuit for generating a discriminating signal when a stepped-up voltage is lower than a previously set value, an oscillating circuit responding to the discriminating signal to oscillate to generate an oscillation signal, a plurality of control circuits receiving the discriminating signal and the oscillation signal in a phase different from one control circuit to another, and a plurality of charge pump circuits independently controlled by the plurality of control circuits, respectively, wherein each of the control circuits includes a storing means for storing a logical condition of an output from the control circuit to a corresponding charge pump circuit when the corresponding charge pump circuit stopped its charge pump operation, a first means receiving the oscillation signal for outputting the oscillation signal as its is to the corresponding charge pump circuit, and a second means receiving the oscillation signal for outputting an inverted signal of the oscillation signal to the corresponding charge pump circuit, the first means and the second means being controlled by the storing means to be alternatively activated to supply a logical condition opposite to the stored logical condition, to the corresponding charge pump circuit, when the corresponding charge pump circuit restarts its charge pump operation.

The above and other objects, features and advantages of the present invention will be apparent from the following description of preferred embodiments of the invention with reference to the accompanying drawings.

DESCRIPTION OF THE PREFERRED EMBODIMENTS

Figure 5:
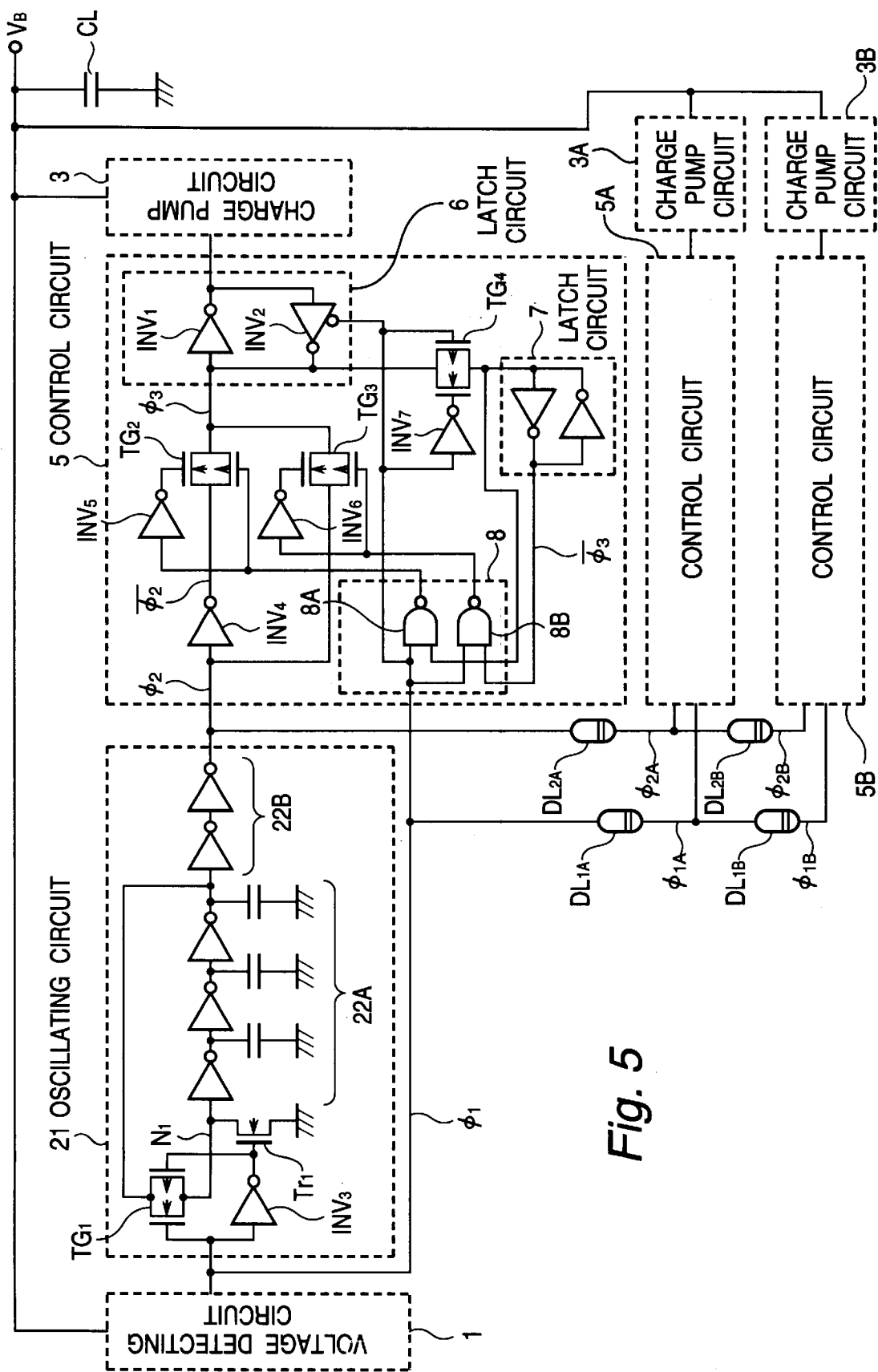
FIG. 5 is a circuit diagram of one embodiment of the voltage step-up circuit in accordance with the present invention.

Referring to FIG. 5, there is shown a circuit diagram of one embodiment of the voltage step-up circuit in accordance with the present invention. In FIG. 5, elements corresponding to those shown in FIG. 1 are given the same Reference Numerals.

Figure 2:
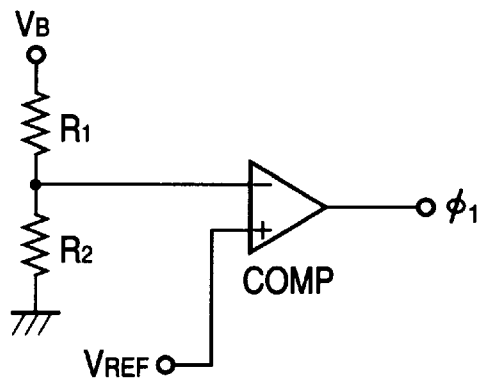
FIG. 2 is a circuit diagram illustrating one example of the voltage detecting circuit incorporated in the prior art voltage step-up circuit shown in FIG. 1.
Figure 3:
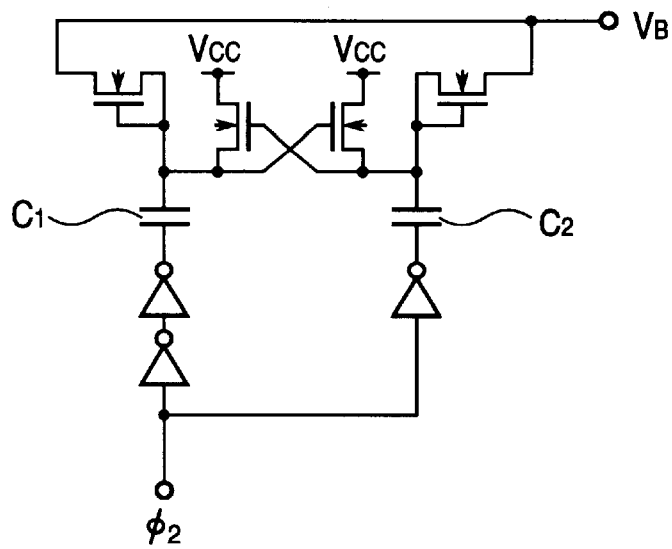
FIG. 3 is a circuit diagram illustrating one example of the construction of the charge pump circuit incorporated in the prior art voltage step-up circuit shown in FIG. 1.
Figure 4:
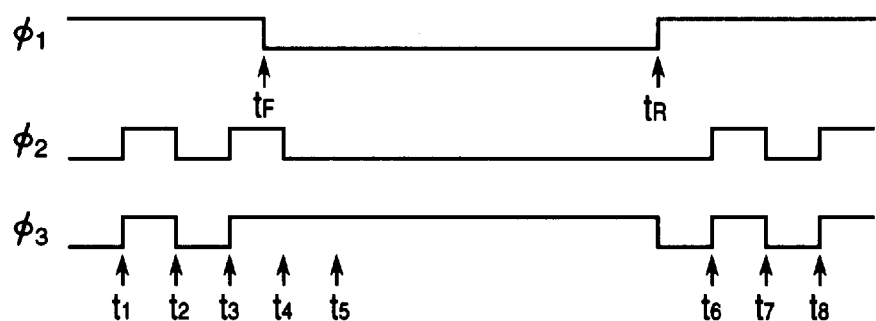
FIG. 4 is a timing chart for illustrating the operation of the prior art voltage step-up circuit shown in FIG. 1.

The shown embodiment of the voltage step-up circuit in accordance with the present invention includes a voltage detecting circuit 1, an oscillating circuit 21, a plurality of control circuits 5, 5A and 5B and a plurality of charge pump circuits 3, 3A and 3B, a compensating capacitor CL, which are connected as shown. The voltage detecting circuit 1 is the same as that shown in FIG. 2, and each of the plurality of charge pump circuits 3, 3A and 3B is the same as that shown in FIG. 3. Therefore, explanation of these circuits will be omitted for simplification of description. In addition, since the control circuits 5, 5A and 5B have the same construction, an internal construction of only the control circuit 5 is shown in FIG. 5.

Figure 1:
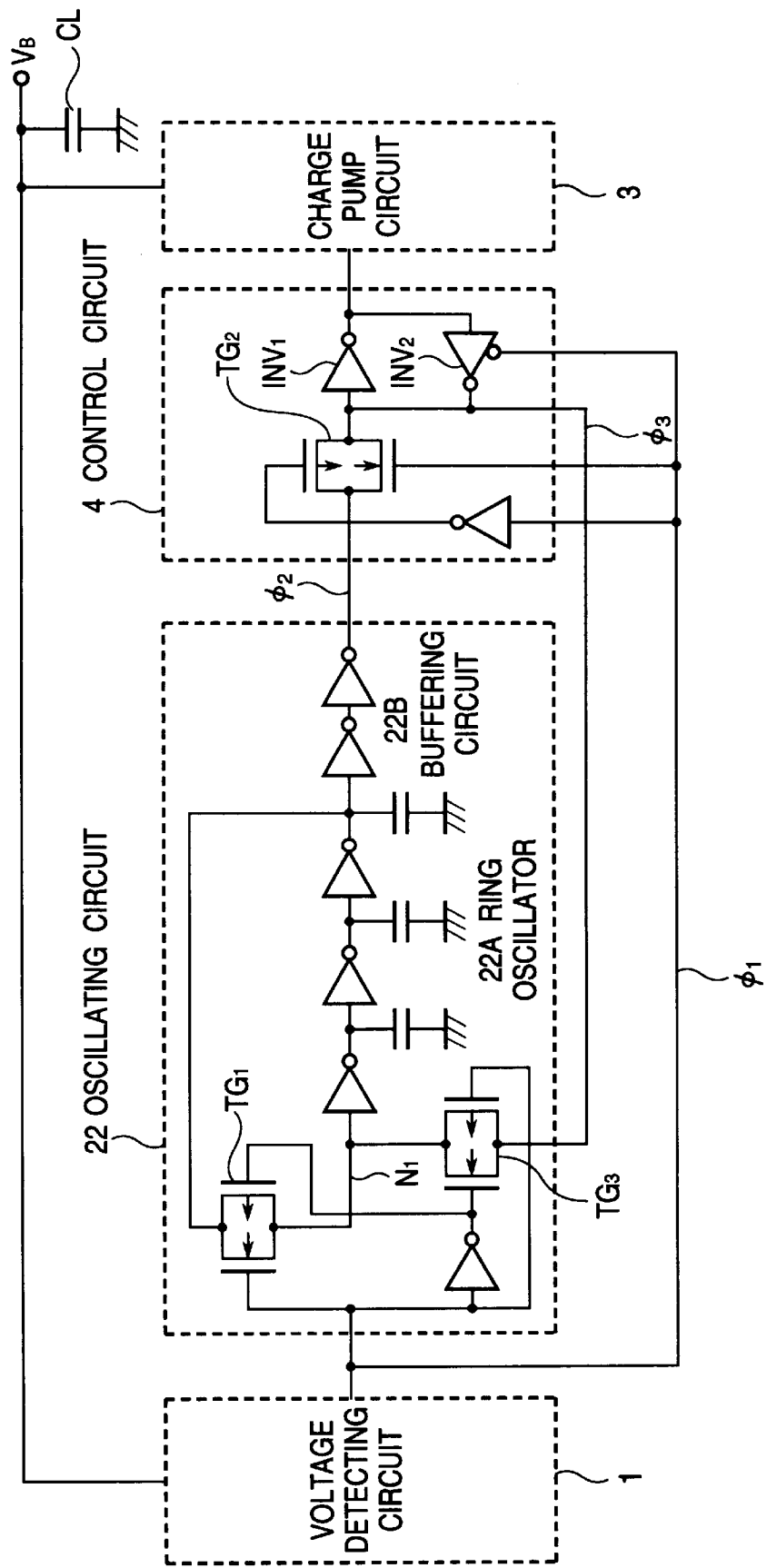
FIG. 1 is a circuit diagram of one example of the prior art voltage step-up circuit.

As seen from comparison between FIG. 1 and FIG. 5, the oscillating circuit 21 of the shown embodiment is slightly modified from the oscillating circuit 22 shown in FIG. 1, and each of the control circuits 5, 5A and 5B inserted between the oscillating circuit 21 and the charge pump circuits 3, 3A and 3B, is substantially modified from the control circuit 4 shown in FIG. 1.

In the shown embodiment, the signal $\phi_3$ generated in each of the control circuits 5, 5A and 5B is not fed back to the oscillating circuit 21. In brief, similarly to the prior art, the oscillating circuit 21 includes a ring oscillator 22A constituted of an odd number of cascaded inverters, and a buffering circuit 22B composed of an even number of cascaded inverters, for receiving an output of the ring oscillator to shape the waveform of the oscillation signal generated in the ring oscillator.

An output of a last stage inverter in the ring oscillator 22A is fed back to an input N1 of a first stage inverter, through a transfer gate $TG_1$ consisting of parallel-connected P-channel transistor and N-channel transistor. The N-channel transistor of the transfer gate $TG_1$ has a gate connected to receive the step-up circuit control signal $\phi_1$ outputted from the voltage detecting circuit 1, and the P-channel transistor of the transfer gate $TG_1$ has a gate connected to through an inverter $INV_3$ receive the step-up circuit control signal $\phi_1$. In addition, the input $N_1$ of the first stage inverter in the ring oscillator 22A is connected to a drain of an N-channel transistor Tr1 having a source connected to ground and a gate connected to an output of the inverter $INV_3$.

Therefore, when the step-up circuit control signal $\phi_1$ is at the high level, the transfer gate $TG_1$ is turned on, so that a path is formed to feed back the output of the last stage inverter of the ring oscillator 22A to the input of the first stage inverter, so that the ring oscillator oscillates. At this time, the N-channel transistor Tr1 is maintained off. On the other hand, when the step-up circuit control signal $\phi_1$ is at the low level, the transfer gate $TG_1$ is turned off, so that a path for feeding back the output of the last stage inverter of the ring oscillator 22A to the input of the first stage inverter is cut off, so that the ring oscillator stops its oscillation. In addition, at this time, since the N-channel transistor Tr1 is turned on, so that the input $N_1$ of the first stage inverter in the ring oscillator 22A is connected to ground, and therefore, the output $\phi_2$ of the oscillating circuit 21 is fixed to a predetermined level, for example, a high level in the shown embodiment.

As mentioned above, since the control circuits 5, 5A and 5B have the same construction, only the construction of the control circuit 5 will be described. The control circuit 5 includes an inverter $INV_4$ receiving the output $\phi_2$ of the oscillating circuit 21 for outputting an inverted signal $\overline{\phi_2}$, a transfer gate TG2 receiving the inverted signal $\overline{\phi_2}$, to output the same as a signal $\phi_3$, and a latch circuit 6 receiving and latching the signal $\phi_3$, to output the latched signal to the associated charge pump circuit 3. This latch circuit 6 is constituted of an inverter $INV_1$ and a tristate inverter $INV_2$, similarly to the prior art example shown in FIG. 1, and the tristate inverter $INV_2$ is controlled by the step-up circuit control signal $\phi_1$, similarly to the prior art example shown in FIG. 1. Conventionally, the transfer gate TG2 consists of parallel-connected P-channel transistor and N-channel transistor.

Furthermore, the output $\phi_2$ of the oscillating circuit 21 is supplied as the signal $\phi_3$ to the latch circuit 6 through a transfer gate TG3 consisting of parallel-connected P-channel transistor and N-channel transistor. The signal $\phi_3$ is supplied to a second latch circuit 7 through a transfer gate TG4 consisting of parallel-connected P-channel transistor and N-channel transistor. This second latch circuit 7 is constituted of a pair of inverters parallel-connected in a mutually opposite direction. The transfer gates TG2 and TG3 are controlled by a logic gate circuit 8 receiving an input and an output of the second latch circuit 7 and the step-up circuit control signal $\phi_1$, and the transfer gate TG4 is controlled by the step-up circuit control signal $\phi_1$.

The logic gate circuit 8 includes a NAND gate 8A having a first input connected to receive the step-up circuit control signal $\phi_1$ and a second input connected to receive the signal $\phi_3$ appearing on the input of the latch circuit 7. An output of the NAND gate 8A is connected to a gate of the P-channel transistor of the transfer gate TG2, and through an inverter INV5 to a gate of the N-channel transistor of the transfer gate TG2. The logic gate circuit 8 also includes another NAND gate 8B having a first input connected to receive the step-up circuit control signal $\phi_1$ and a second input connected to receive an inverted signal $\overline{\phi_3}$ (of the signal $\phi_3$) appearing on the output of the latch circuit 7. An output of the NAND gate 8B is connected to a gate of the P-channel transistor of the transfer gate TG3, and through an inverter INV6 to a gate of the N-channel transistor of the transfer gate TG3. Furthermore, the step-up circuit control signal $\phi_1$ is supplied to a gate of the P-channel transistor of the transfer gate TG4, and also through an inverter INV7 to a gate of the N-channel transistor of the transfer gate TG4.

In the above mentioned construction, when the step-up circuit control signal $\phi_1$ is at the high level, namely, when $V_B$ is lower than the set value, the transfer gates TG2 and TG3 are turned on, and when the step-up circuit control signal $\phi_1$ is at the low level, namely, when $V_B$ is not lower than the set value, the transfer gates TG2 and TG3 are turned off. On the other hand, the transfer gate TG4 is on-off controlled in a phase opposite to that of the transfer gates TG2 and TG3. Namely, when the step-up circuit control signal $\phi_1$ is at the high level, the transfer gate TG4 is turned off, and when the step-up circuit control signal $\phi_1$ is at the low level, the transfer gate TG4 is turned on.

The first latch circuit 6 latches the signal $\phi_3$ when the step-up circuit control signal $\phi_1$ is at the low level, namely, when the transfer gates TG2 and TG3 are turned off and the transfer gate TG4 is turned on. The output of the latch circuit 6 is connected to the corresponding charge pump circuit 3. Furthermore, the second latch circuit 7 latches the signal $\phi_3$ when the step-up circuit control signal $\phi_1$ is at the low level, namely, when the transfer gate TG4 is turned on.

The logic gate circuit 8 is controlled by the step-up circuit control signal $\phi_1$ and the signal $\phi_3$, for controlling the transfer gates TG2 and TG3 in a complementary manner. When the step-up circuit control signal $\phi_1$ is at the low level, the logic gate circuit 8 puts the transfer gates TG2 and TG3 in an off condition, regardless of the condition of the signal $\phi_3$. When the step-up circuit control signal $\phi_1$ is at the high level and the signal $\phi_3$ is at the high level, the logic gate circuit 8 puts the transfer gate TG2 in an on condition and maintains the transfer gate TG3 in the off condition. If the step-up circuit control signal $\phi_1$ is at the high level and the signal $\phi_3$ is at the low level, the logic gate circuit 8 puts the transfer gate TG2 in the off condition and puts the transfer gate TG3 in the on condition.

A major feature of the shown embodiment is that, as mentioned hereinbefore, the signal $\phi_3$ is not fed back to the oscillating circuit 21, so that the charge pump 3 is caused to operate with no delay in response to a change in the voltage of the stepped-up node $V_B$.

This feature makes it possible to provide a plurality of charge pump circuits each associated with an independent control circuit, and control the plurality of charge pump circuits by signals $\phi_1$ and $\phi_2$, which are made different in phase from one charge pump circuit to another. Namely, it becomes possible to divide the charge pump into a plurality of charge pump circuits. In the shown embodiment, in order to control a plurality of control circuits 5, 5A and 5B associated to the same number of charge pump circuits 3, 3A and 3B, respectively, with signals $\phi_1$ and $\phi_2$ different in phase from one control circuit to another, the step-up circuit control signal $\phi_1$ and the output signal $\phi_2$ of the oscillating circuit 21 are supplied through delay circuits DL1A and DL2A as delayed signals $\phi_{1A}$ and $\phi_{2A}$ to the control circuit 5A, respectively, and the delayed signals $\phi_{1A}$ and $\phi_{2A}$ are supplied through delay circuits DL1B and DL2B as further delayed signals $\phi_{1B}$ and $\phi_{2B}$ to the control circuit 5B, respectively.

Now, a fundamental operation of the shown embodiment will be described with reference to the timing charts of FIGS. 6A to 6D.

When $V_B$ is lower than the set value, since the step-up circuit control signal $\phi_1$ is at the high level, the output $\phi_2$ of the oscillating circuit 21 continues to oscillate. When the transfer gate TG2 is on and the transfer gate TG3 is off, the signal $\phi_3$ (the output from the transfer gate TG2 of the inverted signal $\overline{\phi_2}$ outputted from the inverter INV4 receiving the signal $\phi_2$) oscillates in the phase opposite to that of the signal $\phi_2$. To the contrary, when the transfer gate TG2 is off and the transfer gate TG3 is on, the signal $\phi_3$ (the output from the transfer gate TG3 of the signal $\phi_2$) oscillates in the same phase as that of the signal $\phi_2$. In any case, the charge pump 3 is caused to operate, so that $V_B$ approaches toward the set value.

When $V_B$ becomes the set value, the step-up circuit control signal $\phi_1$ is brought to the low level, so that the N-channel transistor Tr1 having the gate receiving from the inverter INV3 the inverted signal of the step-up circuit control signal $\phi_1$, is turned on, and the transfer gates TG1, TG2 and TG3 are turned off and the transfer gate TG4 is turned on. Furthermore, the latch circuits 6 and 7 start to operate.

When the step-up circuit control signal $\phi_1$ is brought to the low level, since the transfer gates TG1 is turned off and the N-channel transistor Tr1 is turned on, the output $\phi_2$ of the oscillating circuit 21 is forcibly brought to the high level.

Figure 6A:
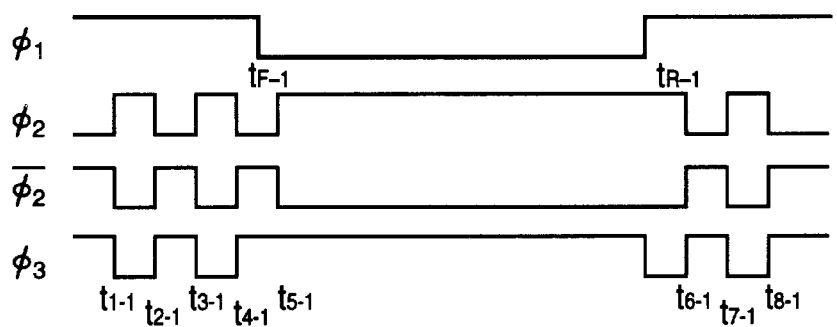
FIGS. 6A to 6D are timing charts for illustrating the operation of the voltage step-up circuit in accordance with the present invention.
Figure 6B:
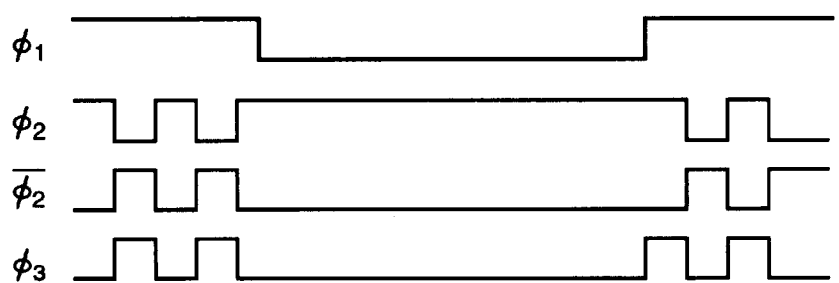
Figure 6C:
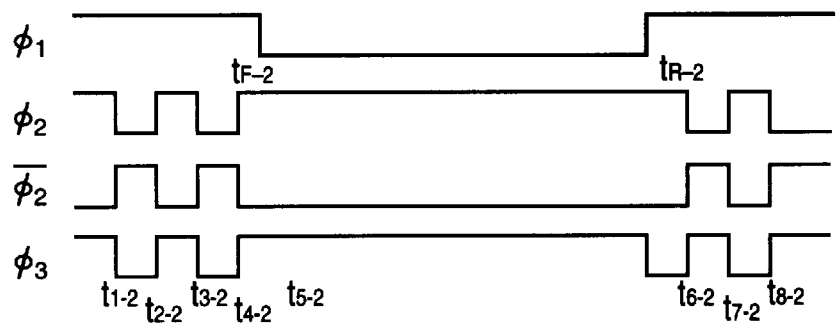
Figure 6D:
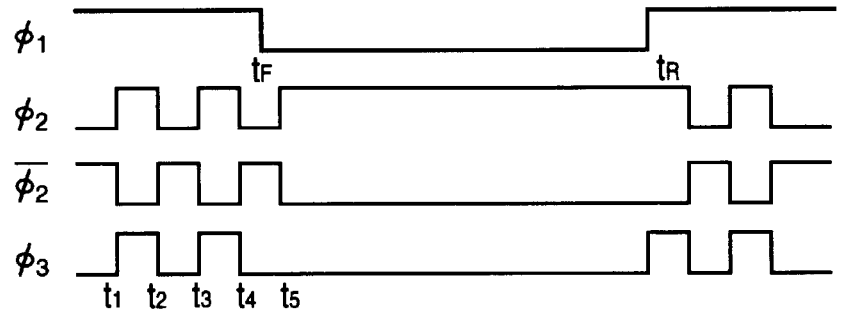

Therefore, when the step-up circuit control signal $\phi_1$ is brought to the low level, if the output $\phi_2$ of the oscillating circuit 21 is at the high level, the oscillating circuit 21 stops the oscillating in that condition, as shown in FIGS. 6B and 6C. On the other hand, when the step-up circuit control signal $\phi_1$ is brought to the low level, if the output $\phi_2$ of the oscillating circuit 21 is at the low level, after the output $\phi_2$ is brought to the high level once, the oscillating circuit 21 stops the oscillating, as shown in FIGS. 6A and 6D.

In this case, if the output $\phi_2$ of the oscillating circuit 21 was supplied directly to the charge pump circuit 3 so as to operate the charge pump 3, the charge pump circuit is caused to operate extra or excessively by the amount corresponding to the fact that the output $\phi_2$ of the oscillating circuit 21 changes from the low level to the high level after the step-up circuit control signal $\phi_1$ was brought to the low level, with the result that $V_B$ becomes higher than the set value.

In order to overcome this problem, in the shown embodiment, the control circuit 5 is configured to control the output $\phi_2$ of the oscillating circuit 21 and the signal $\phi_3$ supplied to the charge pump circuit 3. Namely, when the step-up circuit control signal $\phi_1$ is brought to the low level, the transfer gates TG2 and TG3 are immediately turned off and the latch circuit 6 is immediately put in the latched condition. Therefore, the latch circuit 6 latches and holds the condition of the signal $\phi_3$ at the moment the step-up circuit control signal $\phi_1$ is brought to the low level. Therefore, the charge pump circuit 3 is never caused to operate extra or excessively. In addition, since the transfer gate TG4 is turned on, the latch circuit 7 is supplied with the condition of the signal $\phi_3$ latched and held in the latch circuit 6.

When $V_B$ becomes lower than the set value, the step-up circuit control signal $\phi_1$ becomes the high level, again, so that the first latch circuit 6 stops its holding operation, and the transfer gate TG4 is turned off. As a result, the second latch circuit 7 latches and holds the condition of the signal $\phi_3$ at the moment the step-up circuit control signal $\phi_1$ was brought to the low level, namely, when the signal $\phi_3$ stopped the change of its condition.

On the basis of the logical level of the output of the second latch circuit 7 and the logical level of the step-up circuit control signal $\phi_1$, the logic gate circuit 8 selects, from the non-inverted output signal $\phi_2$ and the inverted output signal $\overline{\phi_2}$ of the oscillating circuit 21, a signal having the logical level opposite to the logical level of the signal $\phi_3$ when the signal $\phi_3$ stopped the change of its condition, by action of the alternative turning-on of the transfer gates TG2 and TG3, so that the selected signal is supplied to the node of $\phi_3$, namely, to the input of the inverter INV$_1$.

Thus, since the signal $\phi_3$ is forcibly inverted, the charge pump circuit 3 starts its operation just after the step-up circuit control signal $\phi_1$ is brought to the high level.

As seen from the above, since the output of the oscillating circuit 21 is not connected directly to the charge pump circuit 3 but connected through the control circuit having a unique construction to the charge pump circuit 3, the charge pump circuit operates, with no delay, in response to the change of the step-up circuit control signal $\phi_1$ outputted from the voltage detecting circuit 1. In other words, the charge pump circuit operates in response to the change of $V_B$ with no delay.

Assuming that a total capacitance of boost capacitors provided in the charge pump circuit is 500 pF, a peak current of the consumed current in the prior art step-up circuit was about 400 mA.

To the contrary, in the shown embodiment, if two charge pump circuits are provided (by deleting the control circuit 5B and the charge pump circuit 3B), the peak current of the consumed current is about 200 mA, and if four charge pump circuits are provided (by adding one additional control circuit and one additional charge pump circuit to the shown embodiment), the peak current of the consumed current is about 100 mA, which is one fourth of the prior art. Therefore, the noises in the DRAM circuit can be reduced or minimized, and the sense amplifier can be caused to stably operate.

The invention has thus been shown and described with reference to the specific embodiments. However, it should be noted that the present invention is in no way limited to the details of the illustrated structures but changes and modifications may be made within the scope of the appended claims.

I claim:

1. A method for controlling a voltage step-up circuit including a voltage detecting circuit for generating a discriminating signal when a stepped-up voltage is lower than a previously set value, an oscillating circuit responding to the discriminating signal to oscillate to generate an oscillation signal, a plurality of control circuits receiving said discriminating signal and said oscillation signal in a phase different from one control circuit to another, and a plurality of charge pump circuits independently controlled by said plurality of control circuits, respectively, the method comprising storing a logical condition of an output from each control circuit to a corresponding charge pump circuit when said corresponding charge pump circuit stopped its charge pump operation, and forcibly giving a logical condition opposite to the stored logical condition, to said corresponding charge pump circuit when said corresponding charge pump circuit restarts its charge pump operation.

2. A voltage step-up circuit including a voltage detecting circuit for generating a discriminating signal when a stepped-up voltage is lower than a previously set value, an oscillating circuit responding to the discriminating signal to oscillate to generate an oscillation signal, a plurality of control circuits receiving said discriminating signal and said oscillation signal in a phase different from one control circuit to another, and a plurality of charge pump circuits independently controlled by said plurality of control circuits, respectively, wherein each of said control circuits includes a storing means for storing a logical condition of an output from said control circuit to a corresponding charge pump circuit when said corresponding charge pump circuit stopped its charge pump operation, a first means receiving said oscillation signal for outputting said oscillation signal as its is to said corresponding charge pump circuit, and a second means receiving said oscillation signal for outputting an inverted signal of said oscillation signal to said corresponding charge pump circuit, said first means and said second means being controlled by said storing means to be alternatively activated to supply a logical condition opposite to the stored logical condition, to said corresponding charge pump circuit, when said corresponding charge pump circuit restarts its charge pump operation.

3. A voltage step-up circuit claimed in claim 2 wherein each of said first means and said second means is constituted of a latch circuit.

4. A voltage step-up circuit including a voltage detecting circuit for generating a discriminating signal when a stepped-up voltage is lower than a previously set value, an oscillating circuit responding to the discriminating signal to oscillate to generate an oscillation signal, a plurality of control circuits receiving said discriminating signal and said oscillation signal in a phase different from one control circuit to another, and a plurality of charge pump circuits independently controlled by said plurality of control circuits, respectively, wherein each of said control circuits includes an inverter receiving said oscillation signal to output an, inverted signal of said oscillation signal, a first switch circuit receiving said inverted signal of said oscillation signal, a second switch circuit receiving said oscillation signal, a latch circuit receiving an output of said first switch circuit and an output of said second switch circuit and having an output connected to a corresponding charge pump circuit, said latch circuit storing a logical condition of said latch circuit outputted to said corresponding charge pump circuit when said corresponding charge pump circuit stopped its charge pump operation, and said first switch circuit and said second switch circuit being controlled by said latch circuit to be alternatively activated to supply a logical condition opposite to the stored logical condition stored in said latch circuit, to said corresponding charge pump circuit, when said corresponding charge pump circuit restarts its charge pump operation.

5. A voltage step-up circuit claimed in claim 4 wherein said first switch circuit is a first transfer gate and said second switch circuit is a second transfer gate, said first transfer gate and said second transfer gate being controlled in a complementary manner, and an output of said first transfer gate and an output of said second transfer gate being connected in common, and wherein said latch circuit includes a first latch circuit having an input connected to the common-connected outputs of said first transfer gate and said second transfer gate and an output connected to said corresponding charge pump circuit, said first latch circuit latching and holding a node signal on the common-connected outputs of said first transfer gate and said second transfer gate when said discriminating signal is inactive, a second latch circuit for latching and holding said node signal through a third transfer gate rendered conductive when said discriminating signal is inactive, and a logic control means receiving said discriminating signal and an output of said first latch circuit to selectively turn on only of said first transfer gate and said second transfer gate so that, when said corresponding charge pump circuit restarts its charge pump operation, of said oscillation signal and said inverted signal of said oscillation signal, a signal having a logical condition opposite to the logical condition held in said second latch circuit, is supplied to said corresponding charge pump circuit.

6. A voltage step-up circuit claimed in claim 5 wherein said oscillating circuit includes a switch means for forcibly fixing a logical level of said oscillation signal outputted from said oscillating circuit to a previously fixed level when said discriminating signal becomes inactive.

7. A voltage step-up circuit claimed in claim 5 wherein said discriminating signal and said oscillation signal are supplied to a first control circuit of said plurality of control circuits with no delay circuit, and supplied to a second control circuit of said plurality of control circuits with delay circuits, respectively.

8. A voltage step-up circuit claimed in claim 4 wherein said discriminating signal and said oscillation signal are supplied to a first control circuit of said plurality of control circuits with no delay circuit, and supplied to a second control circuit of said plurality of control circuits with delay circuits, respectively.

* * * * *